US008275959B2

(12) United States Patent
Ghanem et al.

(10) Patent No.: US 8,275,959 B2
(45) Date of Patent: Sep. 25, 2012

(54) FAILOVER CONTROL OF DUAL CONTROLLERS IN A REDUNDANT DATA STORAGE SYSTEM

(75) Inventors: Ayman Mohammad Ghanem, Colorado Springs, CO (US); Robert George Bean, Monument, CO (US)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 12/861,647

(22) Filed: Aug. 23, 2010

(65) Prior Publication Data

US 2010/0325480 A1 Dec. 23, 2010

Related U.S. Application Data

(63) Continuation of application No. 10/969,149, filed on Oct. 20, 2004, now abandoned.

(51) Int. Cl.
*G06F 12/00* (2006.01)
*G06F 13/00* (2006.01)

(52) U.S. Cl. ......................... 711/162; 711/161; 711/165

(58) Field of Classification Search .................. 711/161, 711/162, 165

See application file for complete search history.

(56) References Cited

U.S. PATENT DOCUMENTS

| | | | | |
|---|---|---|---|---|
| 7,538,772 | B1 * | 5/2009 | Fouladi et al. | 345/535 |
| 2001/0016878 | A1 * | 8/2001 | Yamanaka | 709/234 |
| 2004/0024807 | A1 * | 2/2004 | Cabrera et al. | 709/201 |

OTHER PUBLICATIONS

Microsoft Computer Dictionary, Copyright 1999, Microsoft Press, Fourth Edition, p. 293.*

* cited by examiner

*Primary Examiner* — Midys Rojas

(74) *Attorney, Agent, or Firm* — Mitchell K. McCarthy; McCarthy Law Group

(57) ABSTRACT

A redundant data storage system is provided comprising a first controller with top-level control of a first memory space and a second controller with top-level control of a second memory space different than the first memory space. The system is adapted for asynchronously reflectively writing state information by the first controller to the second memory space; alternatively the system is adapted for asynchronously reflectively writing state information by the second controller to the first memory space. A method is provided for operating the redundant data storage system by resolving any inconsistency between the existing state information and a modified state information associated with a state information change request, and for switching control in the redundant data storage system between the controllers.

16 Claims, 4 Drawing Sheets

FAILOVER CONTROL OF DUAL CONTROLLERS IN A REDUNDANT DATA STORAGE SYSTEM

RELATED APPLICATIONS

This application is a continuation of co-pending application Ser. No. 10/969,149.

FIELD OF THE INVENTION

The present invention relates generally to computer systems and more particularly but without limitation to failover control in a redundant data storage system.

BACKGROUND

Computer systems can comprise input devices, output devices, one or more processors, and storage media. An operating system provides an application environment and a file system for allocating (and deallocating) storage capacity as files are created, modified, or deleted. Specialized computer systems, such as servers and storage arrays, for example, also employ a file system for allocating storage capacity that is accessed through a network or other connection. Servers and storage arrays store files across a plurality of disc drives, depending on a desired storage format, such as a RAID level, for example. User data files are mapped to one or more areas on one or more disc drives. Mapping includes storage of mirror data or parity data. Configuration information describing the manner in which data files are mapped to one or more disc drives is contained in tables or other data structures termed metadata. As files are created, modified, or deleted, metadata is updated to reflect the allocation or deallocation of storage capacity.

Systems can be multi-threaded and multi-tasking, simultaneously executing a number of processes. Abnormal execution of one process (such as a system process or user application) can cause one or more processes to end in an incomplete manner increasing the likelihood of a system failure. What is needed are enhanced solutions for recovering from such a failure, such as in switching from a master to a redundant controller in supporting hot rebooting of the system following such a failure.

SUMMARY OF THE INVENTION

As embodied herein and as claimed below, the present invention is generally directed to a device and associated method for operating a redundant data storage system.

In some embodiments a redundant data storage system is provided comprising a first controller with top-level control of a first memory space and a second controller with top-level control of a second memory space different than the first memory space. The system is adapted for asynchronously writing state information by the first controller to the second memory space; alternatively the system is adapted for asynchronously writing state information by the second controller to the first memory space. In some embodiments the memory spaces can comprise a reflective memory. The system utilizes a crash recovery record created by one of the controllers associating a state information change request in relation to an existing state. The crash recovery record and modified state information is reflectively written over a communication link, such as a data transfer window comprising a bus joining mapped memory regions of the memory spaces.

In some embodiments a method is provided for operating a redundant data storage system having a first controller and a second controller. The method comprises writing state information by the first controller in a first memory space under top-level control of the first controller, and asynchronously reflectively writing the state information to a second memory space different than the first memory space, the second memory space under top-level control of the second controller. The method can further comprise modifying the state information by the first controller in the first memory space in response to a state information change request by the redundant data storage system, and asynchronously reflectively writing the modified state information to the second memory. Preferably, the method comprises creating a crash recovery record prior to modifying the state information, by associating the state information change request in relation to an existing state, and asynchronously reflectively writing the crash recovery record to the second memory. The method can comprise resolving any inconsistency between the existing state information and the modified state information by invalidating a processor cache that is associated with the second controller. The method can comprise switching control in the redundant data storage system to the second controller by employing the state information previously written to the second memory. The switching operation can comprise combining the state information previously written to the second memory with the crash recovery record. The resolving operation can further comprise clearing the crash recovery record after successfully reflectively writing the modified state information.

In some embodiments a redundant data storage system is provided comprising a storage array comprising at least two independent controllers and means for switching control between the controllers. The means for switching can be characterized by creating a crash recovery record by one of the controllers associated with a state information change request. The means for switching can be characterized by asynchronously reflectively modifying the state information by one of the controllers to a memory space of the other controller. The means for switching can be characterized by resolving inconsistent state information between the controllers associated with modifying the state information.

These and various other features and advantages which characterize the embodiments of the claimed invention will become apparent upon reading the following detailed description and upon reviewing the associated drawings.

DETAILED DESCRIPTION

Figure 1:
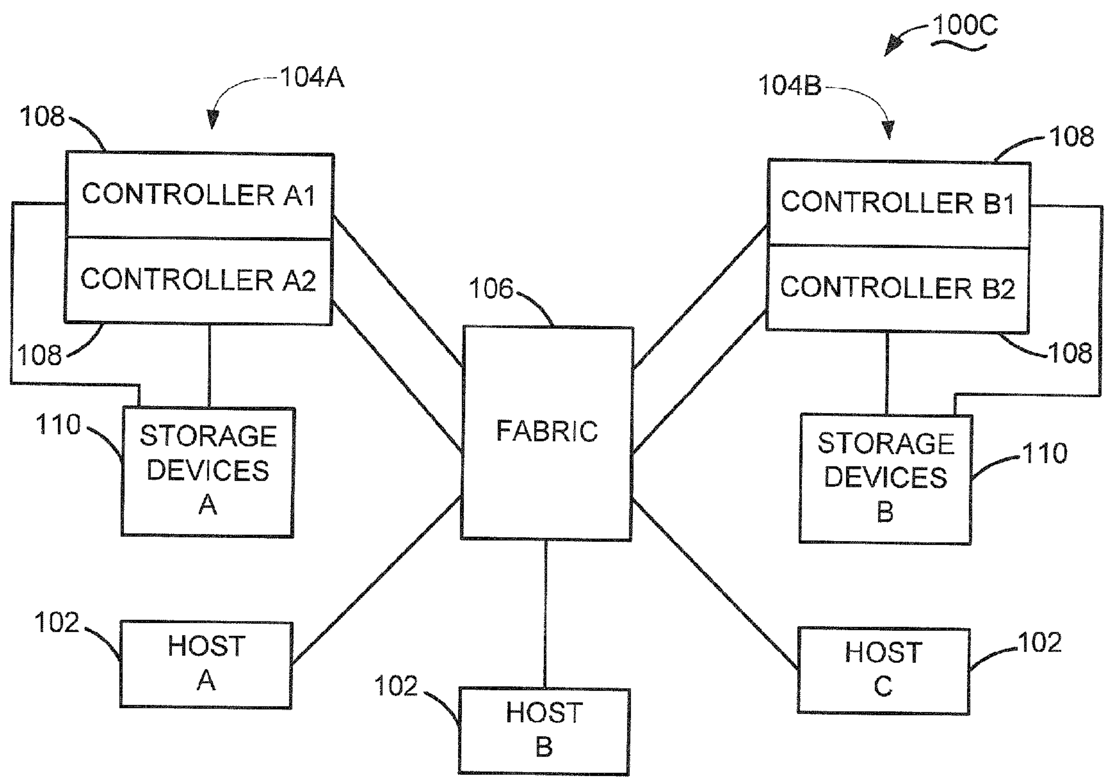
FIG. 1 is a top level functional block depiction of a redundant data storage system characterized as a storage area network (SAN) utilizing mass storage.

To illustrate an exemplary environment in which presently preferred embodiments of the present invention can be advantageously practiced, FIG. 1 shows a redundant data storage system 100 characterized as a SAN utilizing mass storage.

The system 100 includes a number of host computers 102, respectively identified as hosts A, B, and C. The host computers 102 interact with each other as well as with a pair of data storage arrays 104 (denoted A and B, respectively) via a fabric 106. The fabric 106 is preferably characterized as fibre-channel based switching network, although other configurations can be utilized as well, including the Internet.

Each array 104 includes a pair of controllers 108 (denoted A1, A2 and B1, B2) and a set of data storage devices 110 preferably characterized as hard disc drives operated as a RAID (redundant array of independent discs). The controllers 108 and data storage devices 110 preferably utilize a fault tolerant arrangement so that the various controllers 108 utilize parallel, redundant links and at least some of the user data stored by the system 100 is stored in a redundant format within at least one set of the data storage devices 110.

It is further contemplated that the A host computer 102 and the A data storage array 104 can be physically located at a first site, the B host computer 102 and B storage array 104 can be physically located at a second site, and the C host computer 102 can be yet at a third site, although such is merely illustrative and not limiting.

Figure 2:
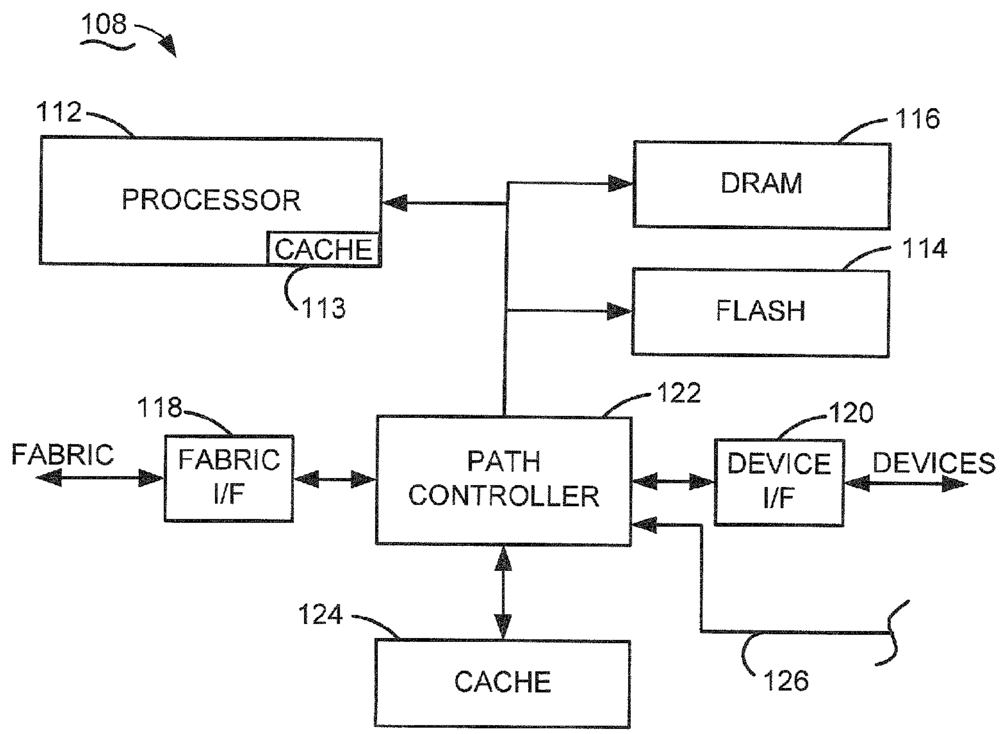
FIG. 2 is a functional block diagram illustrating a selected one of the controllers of FIG. 1

FIG. 2 illustrates a selected one of the controllers 108 in greater detail. The controller 108 can be embodied in a single integrated circuit, or distributed among a number of discrete circuits as desired. A main processor 112 with associated cache 113, preferably characterized as a programmable computer processor, provides top-level control in accordance with programming steps and processing data stored in non-volatile memory 114 (such as flash memory or similar) and in dynamic random access memory (DRAM) 116.

A fabric interface (I/F) circuit 118 communicates with the other controllers 108 and the host computers 102 via the fabric 106, and a device I/F circuit 120 communicates with the storage devices 110. The I/F circuits 118, 120 and a path controller 122 form a pass-through communication path for commands and data between the storage array 104 and the host 102, such as by employing the cache memory 124. Although illustrated discretely, it will be understood that each path controller 122 and the corresponding I/F circuits 118, 120 can be unitarily constructed. A communication link such as a bus 126 (partially shown in FIG. 2) connects the controllers 108A1, 108A2, providing a fault tolerant arrangement in the event of a controller 108 failure.

Figure 3:
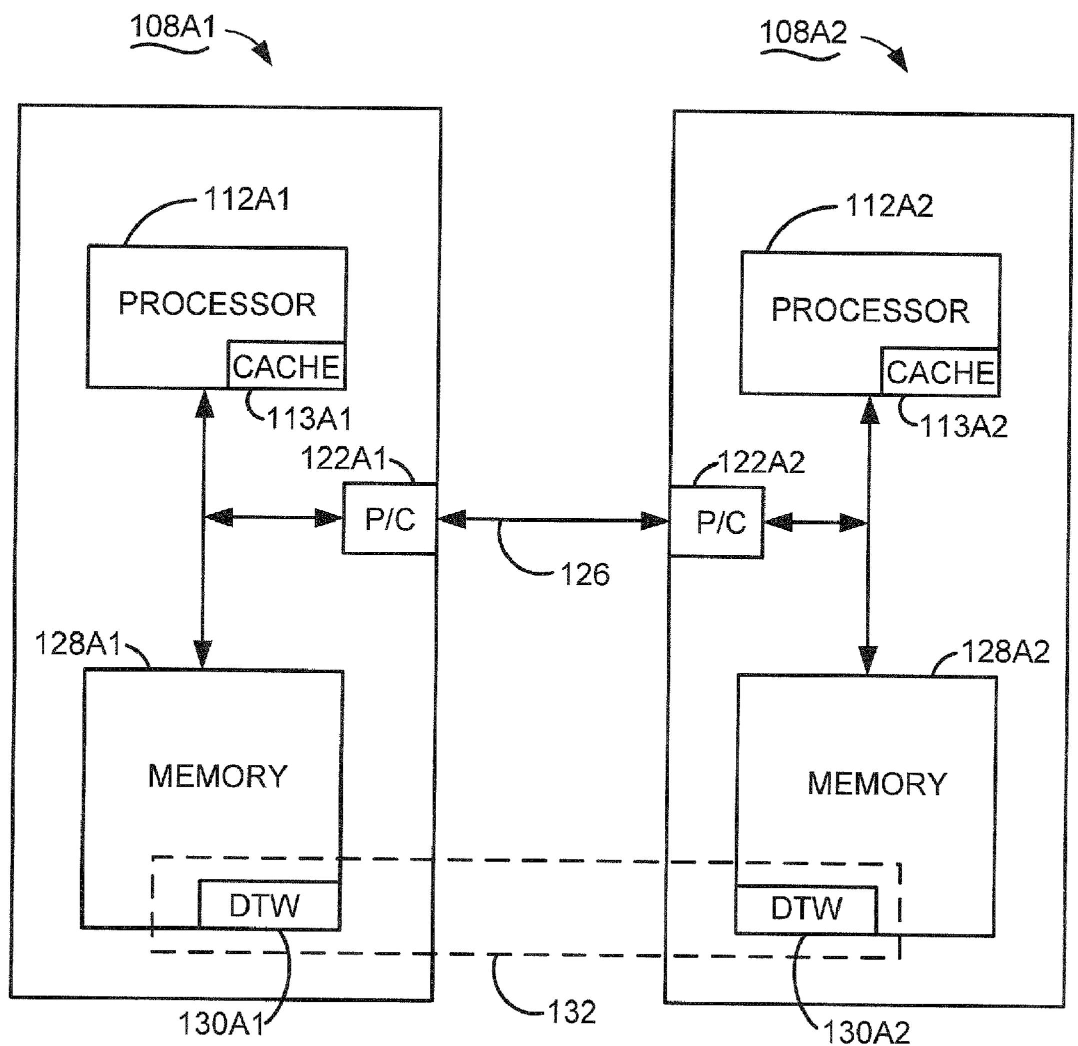
FIG. 3 is a diagrammatic depiction of a portion of both controllers in the system of FIG. 1.

FIG. 3 is a diagrammatic representation of a portion of the system 100, illustrating a manner of linking the path controllers 122A1, 122A2 by the bus 126. The system 100 can designate one of the controllers 108A1, 108A2 as assuming master control for processing operations of the array 104, and the other controller 108A1, 108A2 as a redundant controller for use in the event of a failure or otherwise unavailability of the master controller. To that end, the controller 108A1 has top-level control of a memory space 128A1 and the controller 108A2 has top-level control of a memory space 128A2 different than the memory space 128A1. The memory space 128 can comprise portions of the DRAM 116.

The memory 128A1 has a mapped memory region 130A1 that is mirrored in a mapped memory region 130A2 of the memory 128A2. Likewise, the mapped memory region 130A2 is mirrored in the mapped memory region 130A1 of the memory 128A1. These mapped memory regions 130A1, 130A2 in cooperation with the bus 126 define a data transfer window 132 for reflectively writing data to the redundant controller 108 when writing the data locally to the master controller 108.

In other words, the mapped memory regions 130A1, 130A2 can be characterized as reflective memory portions of the respective memories 128A1, 128A2. For example, when data is written by the controller 108A1 to the memory 128A1 in response to a local write command, the path controller 122A1 incidentally packetizes the data into one or more packets and pushes the packet(s) through the data transfer window 132 and reflectively writes the data to a corresponding address in the reflective memory 130A2. Likewise, data that is written by the path controller 122A2 to the memory 128A2 in response to a local write command is reflectively written to the reflective memory 130A1.

The data storage capacity of an array 104 is defined by the extent of the data storage devices 110 in a given array 104. State information is ordered data that can be written to and read from an array 104, defining data structures and object attributes. For example, state information can define the existence of and identity of a logical disc. The state information can further identify the circumstance under which a logical disc should be presented to the host.

The state information changes when a user command arrives to modify an object attribute. Embodiments of the present invention contemplate a fast and efficient arrangement and associated methodology for providing the current state of the system 100, as defined by the ever-changing state information, to the redundant controller 108 in the event of a failover to the redundant controller 108. To that end, preferably the master controller 108 reflectively writes modified state information asynchronously for substantially instantaneous access of the redundant controller 108 to the most current state information. By "asynchronously" it is meant that the modified state information is pushed through the data transfer window 132 and stored directly to the associated reflective memory 130, without the delay associated with acknowledging the reflective writes from the redundant controller 108 back to the master controller 108.

Advantages of this relatively loosely coupled arrangement of multiple processors 112A1, 112A2 existing in a unified external state include the instantaneous accessibility of the redundant controller 108 to the current state in the event of a failover. This makes a hot reboot of the system 100 possible immediately in recovering from the failover. For example, it is intended that embodiments practiced in accordance with the embodiments of the present invention support rebooting the system 100 in less than one second following the failover.

A failover that occurs while the master controller 108 is updating the state information can make maintaining a consistent state between the controllers 108 problematic. One manner of resolving this potential problem is by having the master controller 108 create a crash recovery record and reflectively write it to the redundant controller 108. The crash recovery record associates a state information change request by the system 100 in relation to an existing state of the system 100. In other words, the crash recovery record is stored data that defines the state changes resulting from a configuration change request by the system 100. The crash recovery record can be used by the controller 108 in remedying an event making the present state lost or otherwise inconsistent.

Preferably, to the greatest extent possible the crash recovery record consists only of resultant data, and not formulaic data, such that it is not used to reinitiate any processes during the state recovery. In this manner, the recovery record requires no intelligence or decision-making for recovery. Rather, the crash recovery involves only mechanistic calculations such as address determinations and writes.

This arrangement makes the recovery code both simple and reliable. The actual address of where to write data can be implied by location in the recovery record, implied by reference to other constructs (i.e. logical device number), or can be explicit with an actual address in the recovery record. Particularly advantageous is that this permits the recovery record to be used in code for an idempotent updating of the state information, ensuring the fastest recovery possible. Addresses identifying locations within the system 100 can be written to the recovery record for each map, table or other data structure to be updated. Alternatively, information within the recovery record, such as the logical device numbers and storage grid numbers, can provide information from which the storage address can be generated.

Figure 4:
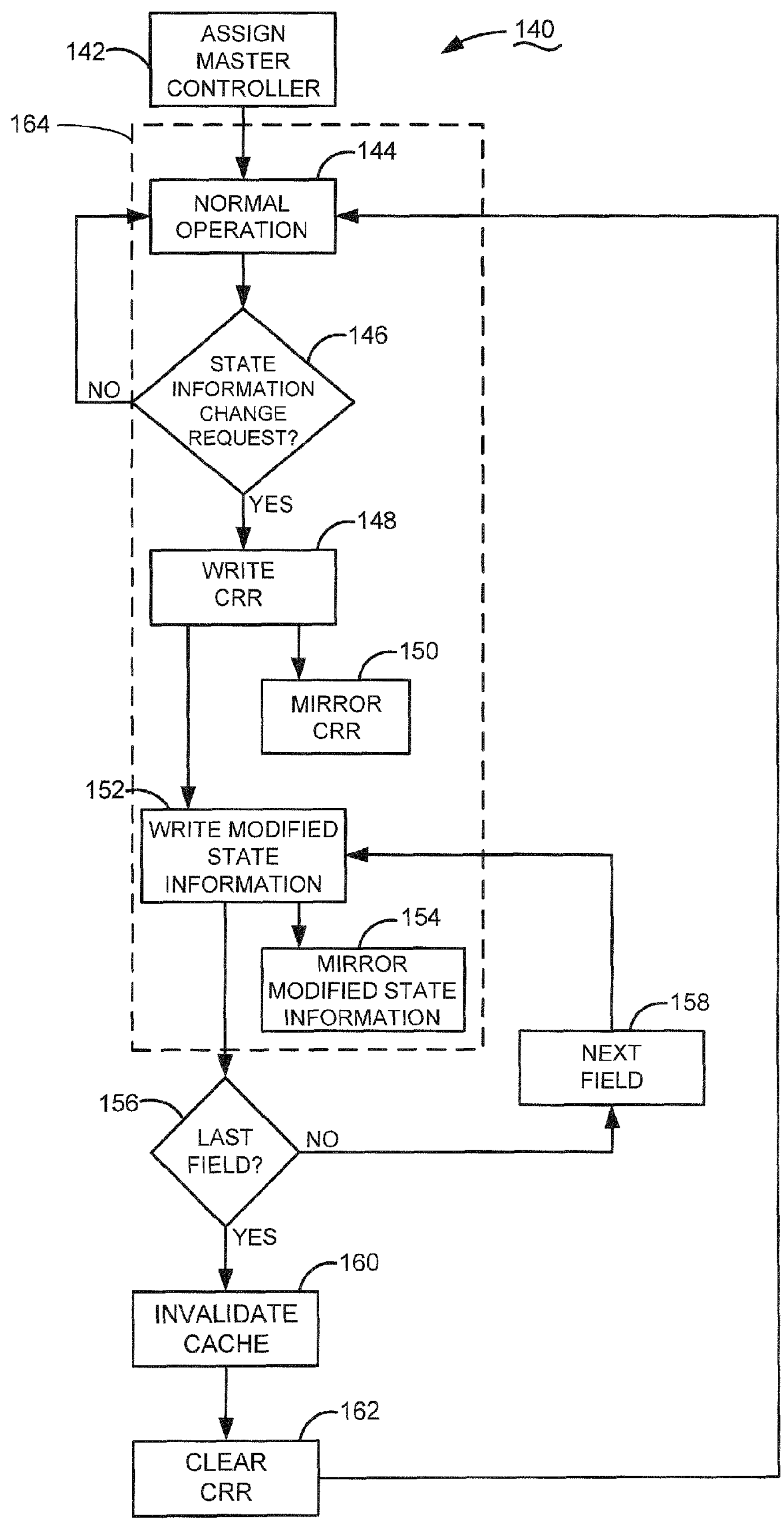
FIG. 4 is a flow chart illustrating steps for practicing a method for OPERATING A REDUNDANT ARRAY STORAGE SYSTEM in accordance with embodiments of the present invention.

FIG. 4 is a flow chart illustrative of steps for a method 140 of operating the redundant data storage system 100 in accordance with embodiments of the present invention. The system 100 initially assigns control to a master controller in block 142. The master controller 108 can be either controller 108A1, 108A2; accordingly, the redundant controller 108 will be the other controller 108A1, 108A2. For purposes of illustration in the description that follows, the method 140 begins with controller 108A1 assuming master control.

Under control of the controller 108A1, the system 100 assumes normal data transfer and manipulation operations in block 144. In block 146 it is determined whether a state information change request has been commanded by the system 100, such as incident with an allocation (or deallocation) request or an object attribute change or the like. If the determination of block 146 is no, then control returns to normal operations in block 144. Otherwise, control passes to block 148 wherein the controller 108A1 creates the crash recovery record and writes the crash recovery record locally in memory 128A1. In block 150 controller 108A1 asynchronously reflectively writes the crash recovery record to the memory 128A2.

After completing a valid crash recovery record, control passes to block 152 wherein the controller 108A1 modifies the state information locally in memory 128A1 one field at a time in accordance with the state information change request. In block 154 the controller 108A1 asynchronously reflectively writes the modified state information to the memory 128A2. Determination block 156 ascertains whether the controller 108A1 has written the last field of the modified state information, and if not, then advances to the next field in block 158 and returns control to block 152 for further modifying. Otherwise, with a complete set of modified state information written to the memory 128A1, in block 160 the controller 108A1 pushes a command through the data transfer window 132 to invalidate the processor cache 113A2 of the redundant controller 108A2, to the extent of addresses in the processor cache 113A2 affected by the reflective writes (state update). This resolves any inconsistency between the previous state and the current state between the controllers 108A1, 108A2. The controller 108A1 then clears the crash recovery record in block 162 and control returns to normal operations in block 144.

Figure 5:
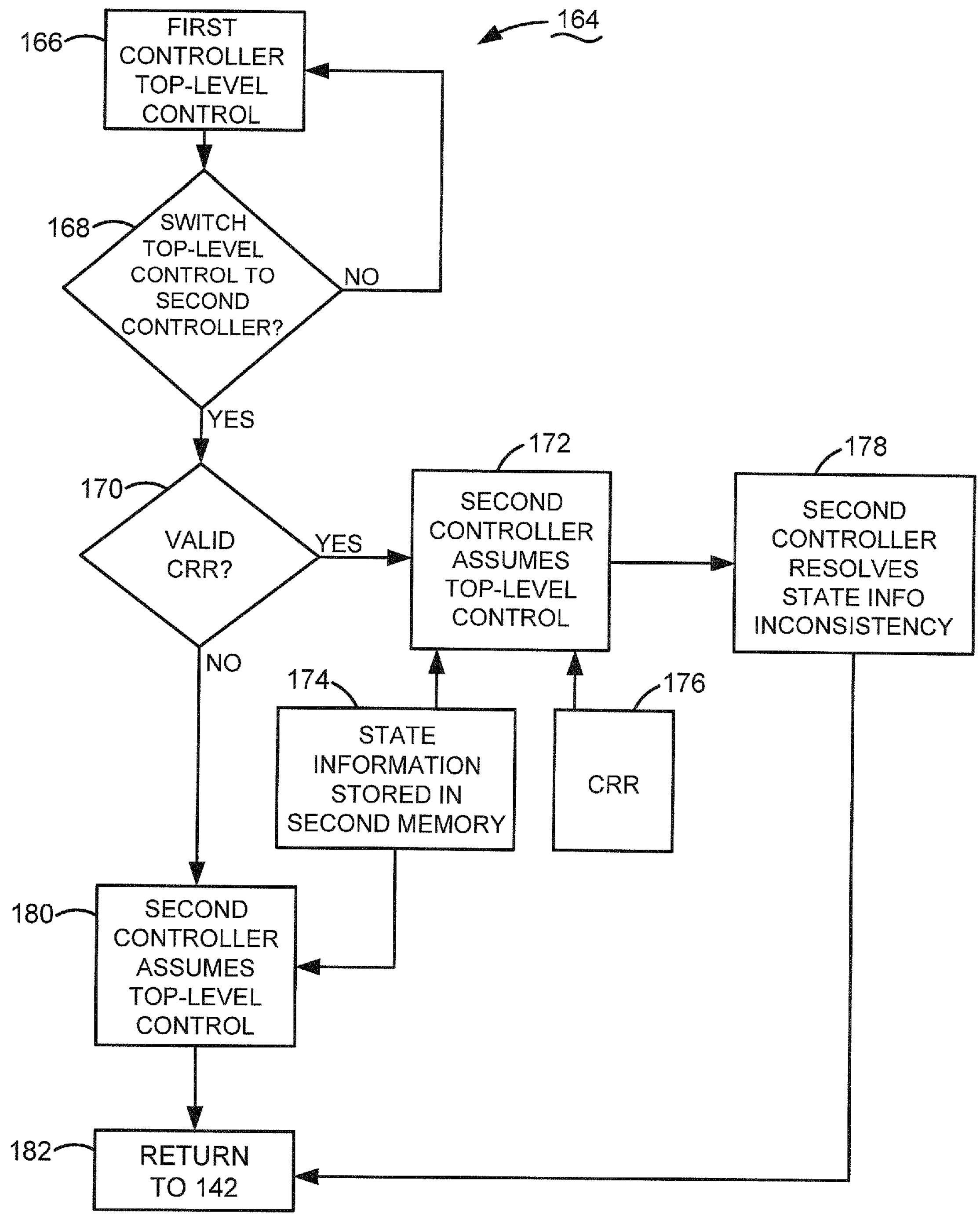
FIG. 5 is a flow chart illustrating steps for practicing a method for SWITCHING CONTROL in the method of FIG. 4.

Block 164 illustrates a switching operation for switching operational control between the controllers 108A1, 108A2. Switching can occur during normal operations 144 of the system 100 or during an update of the state information incident with the state information change request 146. FIG. 5 is a flowchart of illustrative steps for a method of switching the system 100 control from the controller 108A1 to the controller 108A2. Although not shown in FIG. 5, the switching operation 164 can switch control from controller 108A2 to controllers 108A1 in like manner.

For illustrative purposes, the method 164 initially recognizes the controller 108A1 as assuming master control in block 166, as assigned in block 142 in FIG. 4. Determination block 168 ascertains whether a switching of control to the controller 108A2 is warranted, such as in a failover event or the otherwise unavailability of the controller 108A1. If switching is not called for then control returns to block 166.

Upon a command for switching from the system 100 in determination block 168, in block 170 the controller 108A2 determines whether a valid crash recovery record exists in the memory 128A2. If yes, then in block 172 the controller 108A2 obtains the state information that was previously stored in the memory 128A2 in block 174, and combines it with the crash recovery record from the memory 128A2 previously stored in block 176. Control then passes to block 178 where the controller 108A2 resolves any state information inconsistency between the controllers 108, such as by invalidating the processor cache 113A1 and clearing the crash recovery record stored.

If it is determined in block 170 that no valid crash recovery record exists, then control passes to block 180 where the controller 108A2 obtains the state information from block 174. In any event, control then passes to block 182 which, in turn, passes control to block 142 of FIG. 4 wherein the controller 108A2 assumes master control of the array 104.

Generally, the embodiments of the present invention contemplate a redundant data storage system comprising a storage array with at least two independent controllers and means for switching control between the controllers. The means for switching can be characterized by one of the controllers creating a crash recovery record, modifying state information associated with a state information change request, and asynchronously reflectively writing both the crash recovery record and the modified state information to the other controller. The means for switching can also be characterized by resolving any inconsistent state information between the controllers whether control actually switches or not.

While the foregoing examples are directed to configuration of data storage systems (and can be applied to storage systems employing any media including but not limited to disc drives, WORM drives, writeable CD ROMS, DVDs, EEPROM, semiconductor RAM, and EEPROM), embodiments of the present invention can be applied to other hardware and software configurable elements of computer systems including component and connection configurations, such as network interfaces and graphics adapters, and to software configurations, such as application environment settings, register settings, passwords, and the like. For example, methods of the present invention can be applied to setting a password such that if a crash occurs while the password is being changed and the password is corrupted, a recovery record can be employed to write a non-corrupted password. As such, a system information change request comprises any request that updates configuration information of a system.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular data storage structure without departing from the spirit and scope of the present invention.

What is claimed is:

1. A redundant data storage system comprising a first controller with top-level control of a first memory space and a second controller with top-level control of a second memory space different than the first memory space, the system adapted for writing state information by the first controller to the second memory space making the state information available to the second controller without a delay associated with acknowledging the writing of state information to the second memory space.

2. The system of claim 1 wherein the second memory space comprises a reflective memory.

3. The system of claim 2 wherein the first memory space comprises a reflective memory.

4. The system of claim 3 alternatively adapted for writing state information by the second controller to the first memory space making the state information available to the first controller without a delay associated with acknowledging the writing of state information to the second memory space.

5. The system of claim 4 comprising a crash recovery record created by one of the controllers associating a state information change request in relation to an existing state of the redundant data storage system.

6. The system of claim 5 comprising a communication link adapted for transmitting the state information and the crash recovery record between the memory spaces.

7. The system of claim 6 wherein the communication link comprises a data transfer window.

8. A method for operating a redundant data storage system having a first controller and a second controller, the method comprising:

writing state information by the first controller in a first memory space under top-level control of the first controller; and reflectively writing the state information to a second memory space different than the first memory space making the state information available to the second controller without a delay associated with acknowledging the writing of state information to the second memory space, the second memory space under top-level control of the second controller.

9. The method of claim 8 further comprising:

modifying the state information by the first controller in the first memory space in response to a state information change request by the redundant data storage system; and reflectively writing the modified state information to the second memory making the modified state information available to the second controller without a delay associated with acknowledging the writing of modified state information to the second memory space.

10. The method of claim 9 further comprising:

creating a crash recovery record prior to modifying the state information step by associating the state information change request in relation to an existing state; and reflectively writing the crash recovery record to the second memory making the crash recovery record available to the second controller without a delay associated with acknowledging the writing of the crash recovery record to the second memory space.

11. The method of claim 10 further comprising resolving any inconsistency between the existing state information and the modified state information by invalidating a cache that is associated with the second controller.

12. The method of claim 11 further comprising switching control in the redundant data storage system to the second controller by employing the state information previously written to the second memory.

13. The method of claim 12 wherein the switching step comprises combining the state information previously written to the second memory with the crash recovery record.

14. The method of claim 13 wherein the resolving step further comprises clearing the crash recovery record.

15. The method of claim 8 wherein the reflectively writing step, making the state information available to the second controller without a delay associated with acknowledging the writing of state information to the second memory space, is characterized by mapping a memory region in each of the first and second memories and linking the controllers.

16. The method of claim 15 wherein the mapping and linking steps are characterized by a data transfer window.

* * * * *